(12) United States Patent
Bae et al.

(10) Patent No.: US 12,232,273 B2
(45) Date of Patent: Feb. 18, 2025

(54) PRINTED CIRCUIT BOARD AND METHOD OF FABRICATING THE SAME

(71) Applicant: LG INNOTEK CO., LTD., Seoul (KR)

(72) Inventors: Yun Mi Bae, Seoul (KR); Soon Gyu Kwon, Seoul (KR); Sang Hwa Kim, Seoul (KR); Sang Young Lee, Seoul (KR); Jin Hak Lee, Seoul (KR); Han Su Lee, Seoul (KR); Dong Hun Jeong, Seoul (KR); In Ho Jeong, Seoul (KR); Dae Young Choi, Seoul (KR); Jung Ho Hwang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/337,706

(22) Filed: Jun. 20, 2023

(65) Prior Publication Data

US 2023/0337370 A1   Oct. 19, 2023

Related U.S. Application Data

(63) Continuation of application No. 17/653,054, filed on Mar. 1, 2022, now Pat. No. 11,723,153, which is a (Continued)

(30) Foreign Application Priority Data

Jul. 15, 2015   (KR) .................. 10-2015-0100404

(51) Int. Cl.
*H05K 1/02*   (2006.01)
*C25D 3/48*   (2006.01)
(Continued)

(52) U.S. Cl.
CPC ............. *H05K 3/244* (2013.01); *C25D 3/48* (2013.01); *C25D 5/022* (2013.01); *C25D 5/48* (2013.01);
(Continued)

(58) Field of Classification Search
CPC .......... H05K 1/0242; H05K 1/09; H05K 1/11; H05K 1/0296
See application file for complete search history.

(56) References Cited

U.S. PATENT DOCUMENTS 5,134,460 A   7/1992   Brady et al.
5,776,663 A   7/1998   Roh
(Continued)

FOREIGN PATENT DOCUMENTS

JP   2011-096721 A   5/2011
JP   2012-019080 A   1/2012
(Continued)

OTHER PUBLICATIONS

Office Action dated Jul. 2, 2023 in Korean Application No. 10-2022-0144859.
(Continued)

*Primary Examiner* — Jeremy C Norris
(74) *Attorney, Agent, or Firm* — Saliwanchik, Lloyd & Eisenschenk

(57) ABSTRACT

A printed circuit board includes an insulating layer, a circuit pattern on the insulating layer, and a surface treatment layer on the circuit pattern. The surface treatment layer includes a bottom surface having a width wider than a width of a top surface of the circuit pattern.

20 Claims, 11 Drawing Sheets

Related U.S. Application Data continuation of application No. 17/236,519, filed on Apr. 21, 2021, now Pat. No. 11,297,720, which is a continuation of application No. 17/005,522, filed on Aug. 28, 2020, now Pat. No. 11,019,731, which is a continuation of application No. 16/717,679, filed on Dec. 17, 2019, now Pat. No. 10,798,827, which is a continuation of application No. 15/878,701, filed on Jan. 24, 2018, now Pat. No. 10,531,569, which is a continuation of application No. 15/594,778, filed on May 15, 2017, now Pat. No. 9,913,383, which is a continuation of application No. 14/831,674, filed on Aug. 20, 2015, now Pat. No. 9,686,860.

(51) Int. Cl.

| | | |
|---|---|---|
| *C25D 5/02* | (2006.01) | |
| *C25D 5/48* | (2006.01) | |
| *C25D 7/12* | (2006.01) | |
| *H05K 1/09* | (2006.01) | |
| *H05K 1/11* | (2006.01) | |
| *H05K 3/10* | (2006.01) | |
| *H05K 3/18* | (2006.01) | |
| *H05K 3/24* | (2006.01) | |
| *C25D 3/38* | (2006.01) | |

(52) U.S. Cl.
CPC .......... *C25D 7/123* (2013.01); *H05K 1/0296* (2013.01); *H05K 1/09* (2013.01); *H05K 1/11* (2013.01); *H05K 3/108* (2013.01); *H05K 3/181* (2013.01); *H05K 3/188* (2013.01); *C25D 3/38* (2013.01); *H05K 2201/0338* (2013.01); *H05K 2201/098* (2013.01); *H05K 2201/0989* (2013.01); *H05K 2201/099* (2013.01); *H05K 2203/1184* (2013.01)

(56) References Cited

U.S. PATENT DOCUMENTS

| | | | |
|---|---|---|---|
| 5,808,360 A | 9/1998 | Akram | |
| 6,596,619 B1 | 7/2003 | Wang et al. | |
| 6,924,553 B2 * | 8/2005 | Ohara | H01L 23/3171 257/737 |
| 7,319,265 B1 * | 1/2008 | Wang | H01L 21/486 257/737 |
| 8,497,584 B2 | 7/2013 | Chen et al. | |
| 2003/0127743 A1 | 7/2003 | Brintzinger | |
| 2007/0069347 A1 | 3/2007 | Lin et al. | |
| 2007/0111401 A1 | 5/2007 | Kataoka et al. | |
| 2007/0114674 A1 | 5/2007 | Brown | |
| 2007/0284738 A1 | 12/2007 | Shimoishizaka et al. | |
| 2008/0308307 A1 | 12/2008 | Chang et al. | |
| 2012/0125668 A1 | 5/2012 | Chang et al. | |
| 2013/0161085 A1 | 6/2013 | Oh et al. | |
| 2014/0061920 A1 | 3/2014 | Hirano et al. | |
| 2015/0027752 A1 | 1/2015 | Takakura | |
| 2015/0068793 A1 | 3/2015 | Kang et al. | |

FOREIGN PATENT DOCUMENTS

| | | |
|---|---|---|
| JP | 2012-169597 A | 9/2012 |
| KR | 10-0674305 B1 | 1/2007 |
| KR | 10-2012-0031725 A | 4/2012 |
| KR | 10-2012-0115034 A | 10/2012 |
| KR | 10-2013-0070471 A | 6/2013 |
| TW | 201042743 A1 | 12/2010 |
| TW | 201318491 A1 | 5/2013 |
| WO | 2010/140725 A1 | 12/2010 |

OTHER PUBLICATIONS

European Search Report dated Dec. 20, 2016 in European Application No. 15181783.
U.S. Office Action dated Oct. 14, 2016 in U.S. Appl. No. 15/241,714.
KIPO Office Action dated Sep. 1, 2016 in Korean Application No. 10-2016-0049000.
Office Action dated Oct. 20, 2016 in U.S. Appl. No. 14/831,674.
Notice of Allowance dated May 15, 2017 in U.S. Appl. No. 14/831,674.
Notice of Allowance dated Jan. 23, 2018 in U.S. Appl. No. 15/594,778.
Notice of Allowance dated Jul. 13, 2018 in U.S. Appl. No. 15/878,701.
Office Action dated Nov. 14, 2019 in U.S. Appl. No. 15/878,701.
Notice of Allowance dated Sep. 11, 2019 in U.S. Appl. No. 15/878,701.
Office Action dated Feb. 22, 2019 in Taiwanese Application No. 104127222.
Office Action dated Jan. 27, 2020 in U.S. Appl. No. 16/717,679.
Office Action dated Mar. 23, 2020 in U.S. Appl. No. 16/717,679.
Notice of Allowance dated Jun. 1, 2020 in U.S. Appl. No. 16/717,679.
Office Action dated Jan. 19, 2021 in Korean Application No. 10-2020-0143126.
Notice of Allowance dated Jan. 22, 2021 in U.S. Appl. No. 17/005,522.
Notice of Allowance dated Dec. 1, 2021 in U.S. Appl. No. 17/236,519.
Office Action dated Apr. 6, 2023 in Chinese Application No. 202010805254.6.
Office Action dated Sep. 15, 2022 in U.S. Appl. No. 17/653,054.
Notice of Allowance dated Mar. 20, 2023 in U.S. Appl. No. 17/653,054.
U.S. Appl. No. 17/653,054, filed Mar. 1, 2022.
U.S. Appl. No. 17/236,519, filed Apr. 21, 2021, now U.S. Pat. No. 11,297,720, issued Apr. 5, 2022.
U.S. Appl. No. 17/005,522, filed Aug. 28, 2020, now U.S. Pat. No. 11,019,731, issued May 25, 2021.
U.S. Appl. No. 16/717,679, filed Dec. 17, 2019, now U.S. Pat. No. 10,798,827, issued Oct. 6, 2020.
U.S. Appl. No. 15/878,701, filed Jan. 24, 2018, now U.S. Pat. No. 10,531,569, issued Jan. 7, 2020.
U.S. Appl. No. 15/594,778, filed May 15, 2017, now U.S. Pat. No. 9,913,383, issued Mar. 6, 2018.
U.S. Appl. No. 14/831,674, filed Aug. 20, 2015, now U.S. Pat. No. 9,686,860, issued Jun. 20, 2017.

* cited by examiner (a)

(b)

PRINTED CIRCUIT BOARD AND METHOD OF FABRICATING THE SAME

CROSS-REFERENCE TO RELATED APPLICATIONS

This application is a continuation of U.S. application Ser. No. 17/653,054, filed Mar. 1, 2022; which is a continuation of U.S. application Ser. No. 17/236,519, filed Apr. 21, 2021, now U.S. Pat. No. 11,297,720, issued Apr. 5, 2022; which is a continuation of U.S. application Ser. No. 17/005,522, filed Aug. 28, 2020, now U.S. Pat. No. 11,019,731, issued May 25, 2021; which is a continuation of U.S. application Ser. No. 16/717,679, filed Dec. 17, 2019, now U.S. Pat. No. 10,798,827, issued Oct. 6, 2020; which is a continuation of U.S. application Ser. No. 15/878,701, filed Jan. 24, 2018, now U.S. Pat. No. 10,531,569, issued Jan. 7, 2020; which is a continuation of U.S. application Ser. No. 15/594,778, filed May 15, 2017, now U.S. Pat. No. 9,913,383, issued Mar. 6, 2018; which is a continuation of U.S. application Ser. No. 14/831,674, filed Aug. 20, 2015, now U.S. Pat. No. 9,686,860, issued Jun. 20, 2017; which claims the benefit under 35 U.S.C. § 119 to Korean Patent Application No. 10-2015-0100404, filed Jul. 15, 2015; all of which are hereby incorporated in their entirety.

BACKGROUND

The disclosure relates to a printed circuit board, and more particularly to a printed circuit board, which includes a circuit pattern having a curved surface in a portion of a lateral side thereof and a surface treatment layer formed through electrolytic plating, and a method of fabricating the same.

A printed circuit board (PCB), which is formed by printing a circuit line pattern on an electrically insulating substrate using a conductive material, such as copper (Cu), signifies a board immediately before electronic components are mounted thereon. That is to say, the PCB signifies a circuit board in which the mounting positions of the electronic components are determined, and circuit patterns are printed on and fixed to the surface of a flat plate to connect the electronic components with each other, in order to densely mount various types of electronic devices on the flat plate.

In general, for the surface treatment of the circuit patterns formed on the PCB, Organic Solderability Preservative (OSP) has been used, and electrolytic nickel/gold, electrolytic nickel/gold-cobalt alloy, or electroless nickel/palladium/gold has been used.

In this case, various surface treatment schemes may be employed according to the use purposes thereof. For example, the surface treatment schemes for soldering, wire-bonding, and a connector may be used.

FIGS. 1(a) and 1(b) are sectional views showing a PCB according to the related art.

Referring to FIGS. 1(a) and 1(b), the PCB includes an insulating layer 10, a plating seed layer 20, a circuit pattern 30, a protective layer 40, a first surface treatment layer 50, and a second surface treatment layer 60.

FIGS. 1(a) and 1(b) show the insulating layer 10, the plating seed layer 20, the circuit pattern 30, the first surface treatment layer 50, and the second surface treatment layer 60 having the same structures except for protective layers 40 having different structures according to the used shape thereof.

In other words, the protective layer 40 shown in FIG. 1(a) covers the entire exposed surface of the insulating layer 10 while covering at least a portion of a top surface of the circuit pattern 30, and has a shape of protruding upward from the surface of the second surface treatment layer 60.

The protective layer 40 shown in FIG. 1(b) serves only as an embankment. Accordingly, the protective layer 40 exposes at least a portion of the surface of the insulating layer 10 in the state that the protective layer 40 does not make contact with the circuit pattern 30.

Meanwhile, the above PCB according to the related art includes the first surface treatment layer 50 including nickel (Ni) and the second surface treatment layer 60 including gold (Au) for the surface treatment of the circuit pattern 30.

In this case, the first surface treatment layer 50 and the second surface treatment layer 60 are generally formed through electroless plating since a seed layer for electroplating does not separately exist.

In addition, to form the first and second surface treatment layers 50 and 60 through the electrolytic plating, a plating seed layer must be additionally formed.

However, design limitations may exist as the additional seed layer is formed in order to perform the electroplating even though the surface treatment of the PCB is generally performed through the electroless plating.

In addition, the surface treatment of the PCB essentially requires the formation of the first surface treatment layer 50 including metal, such as Ni, for the diffusion of the circuit pattern 30 including Cu.

SUMMARY

The embodiment of the disclosure provides a printed circuit board having a surface treatment layer of a circuit pattern formed through electroplating using a plating seed layer used when the circuit pattern is formed, and a method of fabricating the same.

The embodiment of the disclosure provides a printed circuit board, which includes a circuit pattern having a curved surface in at least a portion of a lateral side thereof, and a method of fabricating the same.

The embodiment of the disclosure provides a printed circuit board, which includes a surface treatment layer formed on a circuit pattern and having a width narrower than that of a bottom surface of the circuit pattern and wider than that of a top surface of the circuit pattern, and a method of fabricating the same.

Technical objects of the embodiment may not be limited to the above object and other technical objects of the embodiment will be apparent to those skilled in the art from the following description.

According to the embodiment, there is provided a printed circuit board including an insulating layer, a circuit pattern on the insulating layer, and a surface treatment layer on the circuit pattern. The surface treatment layer includes a bottom surface having a width wider than a width of a top surface of the circuit pattern.

Further, in the circuit pattern, at least one of an upper right lateral side and an upper left lateral side thereof has a predetermined curvature.

In addition, the width of the top surface of the circuit pattern is narrower than a width of a bottom surface of the circuit pattern, and the bottom surface of the circuit pattern includes a first area vertically overlapped with the top surface of the circuit pattern and a second area except for the first area.

In addition, the surface treatment layer includes a gold (Au) surface treatment layer including a metallic material including gold (Au), and a bottom surface of the gold (Au) surface treatment layer directly makes contact with the top surface of the circuit pattern.

The bottom surface of the surface treatment layer has a width narrower than a width of a bottom surface of the circuit pattern.

Further, the surface treatment layer includes a contact area making contact with the top surface of the circuit pattern and a non-contact area that does not make contact with the top surface of the circuit pattern, the second area of the circuit pattern includes a third area that is not vertically overlapped with the non-contact area of the surface treatment layer and a fourth area vertically overlapped with the non-contact area of the surface treatment layer, and the third area has a width wider than a width of the fourth area.

In addition, the width of the third area to the width of the fourth area satisfies a range of 1.5 to 4.0.

Further, a plating seed layer interposed between the insulating layer and the circuit pattern is additionally included, and the plating seed layer serves as a seed layer for the circuit pattern and the surface treatment layer.

In addition at least one of a left lateral side and a right lateral side of the circuit pattern includes a first portion substantially perpendicular to a bottom surface of the circuit pattern and a second portion extending from the first part and having a curved surface with a predetermined curvature.

In addition, a left area or a right area of the surface treatment layer protrudes outward from an upper left lateral side or an upper right lateral side of the circuit pattern, respectively.

Further, a protective layer formed on the insulating layer is additionally included to cover at least a portion of a surface of the insulating layer.

Meanwhile, according to the embodiment, there is provided a method of fabricating a printed circuit board. The method includes preparing an insulating layer formed on a top surface thereof with a plating seed layer, forming a circuit pattern on the insulating layer by performing electroplating with respect to the plating seed layer serving as a seed layer, forming a mask, which has an opening, on the plating seed layer to expose at least a portion of a top surface of the circuit pattern, forming a surface treatment layer on the circuit pattern by performing electroplating with respect to the plating seed layer serving as the seed layer such that the surface treatment layer is filled in at least a portion of the opening, removing the mask from the plating seed layer, and removing the plating seed layer from the insulating layer.

The mask includes a dry film.

In addition, the opening of the mask has a width narrower than a width of the top surface of the circuit pattern, and the at least portion of the top surface of the circuit pattern is covered by the mask.

In addition, the circuit pattern, which exists before the plating seed layer is removed, comprises a first top surface making contact with a bottom surface of the surface treatment layer and a second top surface that does not make contact with the bottom surface of the surface treatment layer, and a portion of the second top surface of the circuit pattern is removed together with the plating seed layer when the plating seed layer is removed.

In addition, the circuit pattern, which exists after the plating seed layer is removed, includes the top surface having the width narrower than a width of the bottom surface of the surface treatment layer In addition, the circuit pattern, which exists after the plating seed layer is removed, has a lateral side extending from the second top surface and having a predetermined curvature.

Further, the surface treatment layer comprises a gold (Au) surface treatment layer including a metallic material including gold (Au), and a bottom surface of the gold (Au) surface treatment layer directly makes contact with the top surface of the circuit pattern.

In addition, the bottom surface of the surface treatment layer has a width narrower than that of the bottom surface of the circuit pattern.

Further, a step of forming a protective layer on the insulating layer to cover at least a portion of a surface of the insulating layer is further included.

According to the embodiment of the disclosure, the surface treatment layer is formed by utilizing a removable film-type material and a plating seed layer used in the circuit pattern, so that the electrolytic surface treatment and the electroless surface treatment can be selectively used without the limitation on the design.

According to the embodiment of the disclosure, the surface treatment layer including Au is formed using the plating seed layer used when the circuit pattern is formed, so that the conventional Ni surface treatment layer serving as a seed layer for the Au surface treatment layer can be omitted. Accordingly, the thickness of a product can be reduced, and product cost can be reduced due to the omission of the Ni surface treatment layer.

In addition, according to the embodiment of the disclosure, the conventional nickel (Ni) surface treatment layer can be omitted, and the surface treatment layer including gold (Au) can be formed directly on the circuit pattern, thereby increasing the electrical conductivity, and reducing the electrical resistance. Accordingly, the RF characteristic may be improved.

In addition, according to the embodiment of the disclosure, the surface treatment layer formed on the circuit pattern has an eave structure of protruding outward from the upper lateral side of the circuit pattern, so that the mounting area of the components mounted on the circuit pattern can be increased. Accordingly, the reliability of a customer can be improved.

The details of one or more embodiments are set forth in the accompanying drawings and the description below. Other features will be apparent from the description and drawings, and from the claims.

DETAILED DESCRIPTION OF THE EMBODIMENTS

Figure 1A:
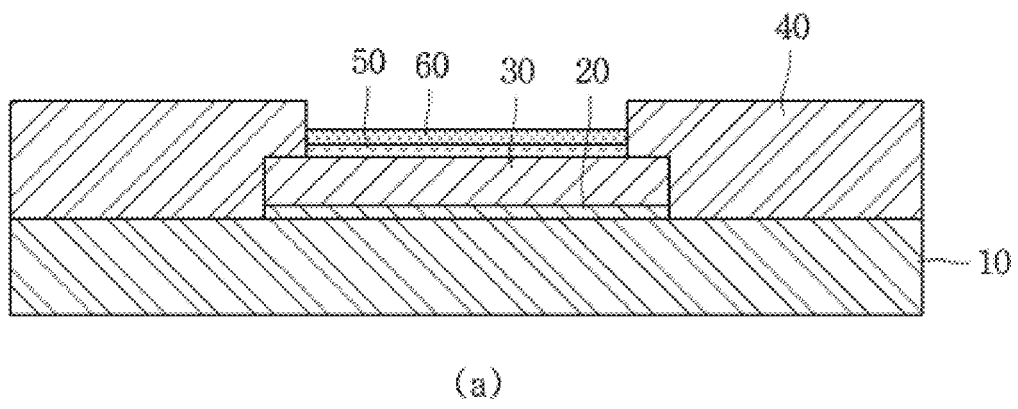
FIGS. 1(a) and 1(b) are sectional views showing a printed circuit board according to the related art.
Figure 1B:
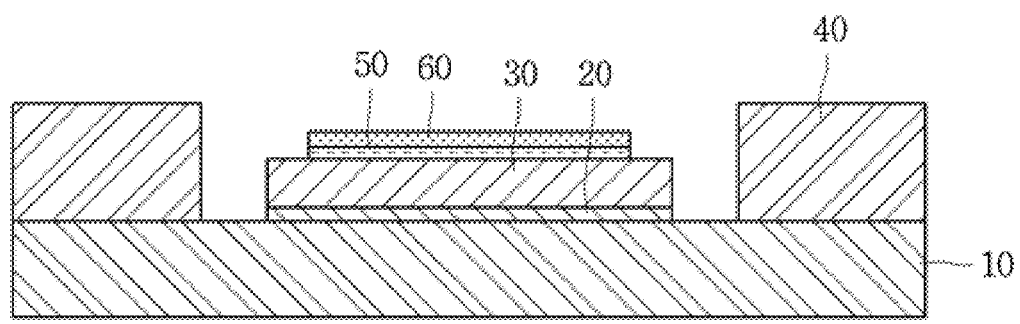

Hereinafter, embodiments of the disclosure will be described in detail with reference to accompanying drawings so that those skilled in the art can easily replicate with the embodiments. However, the embodiments may have various modifications, and the disclosure is not limited thereto.

In the following description, when a predetermined part "includes" a predetermined element, the predetermined part does not exclude other elements, but may further include other components unless otherwise indicated.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that, when a layer, a film, a region, or a plate is referred to as being "on" another layer, another film, another region, or another plate, it can be "directly" on the other layer, film, region, plate, or one or more intervening layers may also be present. Meanwhile, it will be understood that, when a layer, a film, a region, or a plate is referred to as being "directly on" another layer, another film, another region, or another plate, any intervening layer is not present.

The disclosure provides a printed circuit board, in which a conventional Ni surface treatment layer may be omitted by forming a surface treatment layer using a removable film-type material and an additional seed layer, and a portion of the top surface of the circuit pattern may be removed together with the seed layer when the seed layer is removed.

Figure 2:
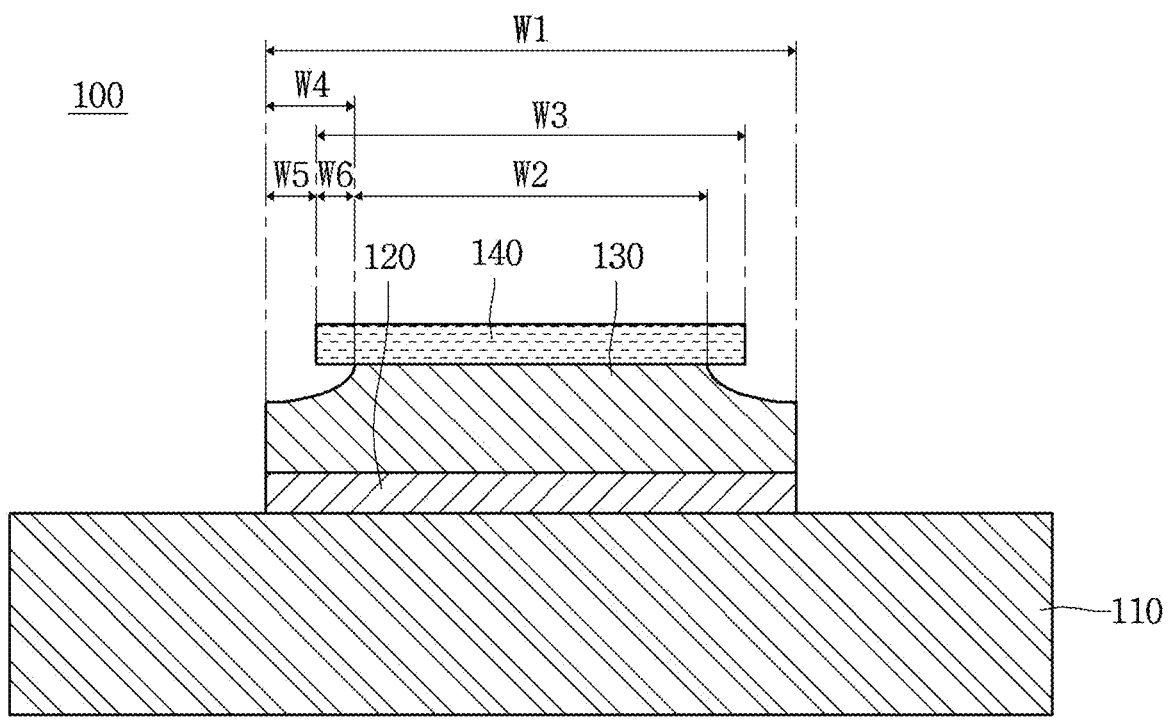
FIG. 2 is a sectional view showing the structure of a printed circuit board according to the first embodiment of the disclosure.
Figure 3:
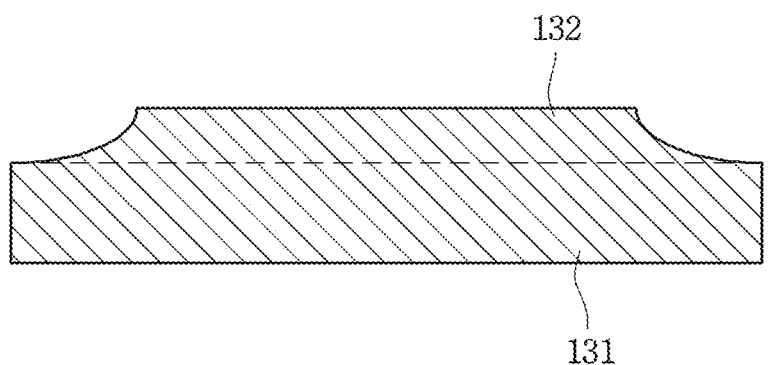
FIG. 3 is a sectional view showing the circuit pattern of FIG. 2 in detail.

FIG. 2 is a sectional view showing the structure of a printed circuit board according to the first embodiment of the disclosure. FIG. 3 is a sectional view showing the circuit pattern of FIG. 2 in detail.

Referring to FIGS. 2 and 3, a printed circuit board 100 includes an insulating layer 110, a plating seed layer 120, a circuit pattern 130, and a surface treatment layer 140.

The insulating layer 110 may mean a support substrate of the printed circuit board 100 having a single circuit pattern, and mean an insulating layer area having one circuit pattern 130 in a printed circuit board having a plurality of lamination structures.

When the insulating layer 110 means one insulating layer constituting the plural lamination structures, a plurality of circuit patterns may be continuously formed on top and bottom surfaces of the insulating layer 110.

The insulating layer 110 may constitute an insulating plate, and may include a thermosetting or thermoplastic polymeric substrate, a ceramic substrate, an organic-inorganic composite substrate, or a glass fiber impregnated substrate. If the insulating layer 110 includes the polymeric resin, the insulating layer may include epoxy insulating resin, or may include polyimide based resin.

The insulating layer 110 is formed thereon with the circuit pattern 130.

Preferably, the plating seed layer 120 to be used when the circuit pattern 130 is formed is formed between the insulating layer 110 and the circuit pattern 130.

The top and bottom surfaces of the plating seed layer 120 may have equal widths.

Then, the circuit pattern 130 is formed on the plating seed layer 120.

Differently from the plating seed layer 120, the circuit pattern 130 may be formed in a shape in which the top and bottom surfaces thereof have mutually different widths. In this case, the width of the bottom surface of the circuit pattern 130 may be equal to the width of the top surface or the bottom surface of the plating seed layer 120, and the width of the top surface of the circuit pattern 130 may be narrower than that of the bottom surface of the circuit pattern 130.

The plating seed layer 120 and the circuit pattern 130 may be formed of metal including copper (Cu) and having electrical conductivity.

The circuit pattern 130 may be formed through an additive process, a subtractive process, a modified semi-additive process (MSAP), or a semi-additive process (SAP), which is a typical process of fabricating a printed circuit board, and the details thereof will be omitted.

Although drawings show that a single circuit pattern 130 is formed on the insulating layer 110, a plurality of circuit patterns 130 may be formed on at least one of the top and bottom surfaces of the insulating layer 110 while being spaced apart from each other.

Hereinafter, the circuit pattern 130 will be described in more detail with reference to FIG. 3. The circuit pattern 130 includes a first part 131 formed on the plating seed layer 120 to have a bottom surface making contact with the top surface of the plating seed layer 120, and a second part 132 formed on the first part 131 to have at least a portion of a top surface making contact with the bottom surface of the surface treatment layer 140.

Although the circuit pattern 130 includes the first part 131 and the second part 132, the first and second parts 131 and 132 are provided only for the purpose of explaining the shape of the circuit pattern 130. Actually, the first and second parts 131 and 132 may be integrated with each other as one component.

The bottom surface of the first part 131 of the circuit pattern 130 directly makes contact with the top surface of the plating seed layer 120.

In this case, the first part 131 of the circuit pattern 130 may have a shape in which the top and bottom surfaces of the first part 131 have equal widths.

In addition, the second part 132 of the circuit pattern 130 has mutually different widths at the bottom and top surfaces thereof.

In other words, in the second part 132 of the circuit pattern 130, the width of the top surface is narrower than that of the bottom surface. Accordingly, the lateral side of the second part 132 is formed with a predetermined curvature lengthwise.

In this case, the second part 132 of the circuit pattern 130 may include a first lateral side having a first curvature and a second lateral side having a second curvature. In addition, the first curvature of the first lateral side may be substantially equal to the second curvature of the second lateral side.

Therefore, the circuit pattern 130 has left and right lateral sides. Each of the left and right lateral sides includes a first portion substantially perpendicular to a main surface and a second portion extending from the first portion and including a curved surface having a predetermined curvature.

The surface treatment layer 140 is formed on the circuit pattern 130 for the surface treatment of the circuit pattern 130.

The surface treatment layer 140 may be formed of metal including gold (Au) or the alloy including Au.

When the surface treatment layer 140 is formed of the alloy including Au, the surface treatment layer 140 may be formed of the Au alloy including cobalt (Co). In this case, the surface treatment layer 140 is formed through the electrolytic plating.

Preferably, the surface treatment layer 140 is formed by performing the electroplating with respect to the plating seed layer 120 that is the same as the plating seed layer used when the circuit pattern 130 is formed.

The surface treatment layer 140 is formed on the circuit pattern 130. Accordingly, the bottom surface of the surface treatment layer 140 directly makes contact with the top surface of the circuit pattern 130.

In this case, the surface treatment layer 140 includes the bottom surface having the width wider than that of the top surface of the circuit pattern 130.

Accordingly, the bottom surface of the surface treatment layer 140 includes a first bottom surface directly making contact with the top surface of the circuit pattern 130 and a second bottom surface that does not make contact with the top surface of the circuit pattern 130.

In this case, the first bottom surface of the surface treatment layer 140 may be the central area of the bottom surface of the surface treatment layer 140, and second bottom surfaces of the surface treatment layer 140 may be left and right areas of the surface treatment layer 140.

In addition, the surface treatment layer 140 may have a shape in which the width of the top surface is equal to that of the bottom surface.

Meanwhile, the top and bottom surfaces of the surface treatment layer 140 may have widths narrower than that of the bottom surface of the circuit pattern 130.

Accordingly, as shown in FIG. 2, the surface treatment layer 140 has an eave structure of protruding outward from the upper lateral side of the circuit pattern 130.

As described above, according to the disclosure, the surface treatment layer 140 including Au is formed using the plating seed layer 120 used when the circuit pattern 130 is formed, the nickel (Ni) surface treatment layer serving as the seed layer of the gold (Au) surface treatment layer may be removed In addition, as described above, according to the disclosure, the conventional nickel (Ni) surface treatment layer is omitted, and the surface treatment layer 140 including gold (Au) is formed directly on the circuit pattern 130, thereby increasing the electrical conductivity, and reducing the electrical resistance. Accordingly, the RF characteristic may be improved.

In addition, as described above, according to the disclosure, the surface treatment layer 140 formed on the circuit pattern 130 has an eave structure of protruding outward from the upper lateral side of the circuit pattern 130, so that the mounting area of the components mounted on the circuit pattern may be increased. Accordingly, the reliability of a customer may be improved.

Hereinafter, the relationship between the circuit pattern 130 and the surface treatment layer 140 will be described in more detail.

Referring to FIG. 2, the circuit pattern 130 has the top surface and the bottom surface having widths different from each other. In this case, the bottom surface of the circuit pattern 130 has a first width W1, and the top surface of the circuit pattern 130 has the second width W2 narrower than the first width W1.

Accordingly, the bottom surface of the circuit pattern 130 includes a second area vertically overlapped with the top surface of the circuit pattern 130, and a first area that is not overlapped with the top surface of the circuit pattern 130.

In addition, the surface treatment layer 140 is formed on the circuit pattern 130, and the top surface and the bottom surface of the surface treatment layer 140 have equal third widths W3.

In this case, the third width W3 is narrower than the first width W1 and wider than the second width W2.

Accordingly, the bottom surface of the surface treatment layer 140 includes a contact area making contact with the top surface of the circuit pattern 130 and a non-contact area that protrudes outward of the top surface of the circuit pattern 130 beyond the contact area and does not make contact with the top surface of the circuit pattern 130.

In this case, the bottom surface of the circuit pattern 130 may have a width wider than that of the top surface of the circuit pattern 130 by a fourth width W4.

That is to say, the first area of the circuit pattern 130 may have the fourth width W4.

In this case, the first area of the circuit pattern 130 is partially overlapped with the non-contact area of the surface treatment layer 140.

In other words, the first area of the circuit pattern 130 includes a third area that is not vertically overlapped with the non-contact area of the surface treatment layer 140 and has a fifth width W5, and a fourth area that is vertically overlapped with the non-contact area of the surface treatment layer 140 and has a sixth width W6.

In this case, preferably, the fifth width W5 of the third area is wider than the sixth width W6 of the fourth area.

More preferably, the ratio of the fifth width W5 to the sixth width W6 is in the range of 1.5 to 4.0.

In other words, when the ratio of the fifth width W5 to the sixth width W6 is less than 1.5, the non-contact area of the surface treatment layer 140 has a wider area. In this case, the non-contact area of the surface treatment layer 140 protruding outward of the top surface of the circuit pattern 130 has an unstable structure, so that the non-contact area may be collapsed, thereby causing the electrical short.

In addition, when the ratio of the fifth width W5 to the sixth width W6 is more than 4.0, the non-contact area of the surface treatment layer 140 has a narrower width. In this case, as the entire width of the surface treatment layer 140 is narrowed, the mounting area may be narrowed.

Therefore, according to the disclosure, when the surface treatment layer 140 having the eave structure is formed as described above, the ratio of the fifth width W5 to the sixth width W6 satisfies the range of 1.5 to 4.0. In this case, the fifth width W5 is wider than the sixth width W6, so that the fifth width W5 has a value ranging from 1.5 to 4 times that of the sixth width W6.

Hereinafter, a method of fabricating the printed circuit board shown in FIG. 2 will be described in detail with reference to FIGS. 4 to 11.

FIGS. 4 to 11 are sectional views showing the method of fabricating the printed circuit board of FIG. 2 in process sequence.

Figure 4:
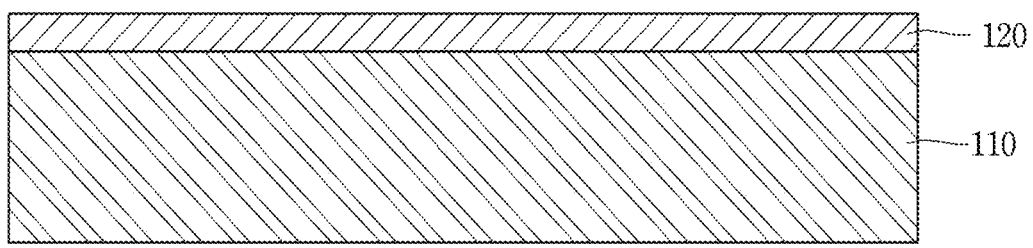
FIGS. 4 to 11 are sectional views showing a method of fabricating the printed circuit board of FIG. 2 in process sequence.

Referring to FIG. 4, after preparing the insulating layer 110, the plating seed layer 120 is formed on the prepared insulating layer 110.

The plating seed layer 120 may be formed by performing electroless plating with respect to the insulating layer 110 using metal including Cu.

The insulating layer 110 may include a thermosetting or thermoplastic polymeric substrate, a ceramic substrate, an organic-inorganic composite substrate, or a glass fiber impregnated substrate. If the insulating layer 110 includes the polymeric resin, the insulating layer 110 may include epoxy insulating resin, or may include polyimide based resin.

The plating seed layer 120 may be formed by performing typical copper clad laminate (CCL) instead of the electroless plating with respect to the surface of the insulating layer 110.

In this case, when the plating seed layer 120 is formed through the electroless plating, surface roughness is applied to the top surface of the insulating layer 110, so that the electroless plating may be smoothly performed.

The electroless plating scheme may be performed in the sequence of a degreasing process, a soft etching process, a pre-catalyst process, a catalyst treatment process, an accelerator process, an electroless plating process, and an anti-oxidation treatment process. In addition, the plating seed layer 120 may be formed by sputtering metallic particles using plasma.

In this case, before forming the plating seed layer 120 through the plating process, a desmear process of removing smears from the surface of the insulating layer 110 may be additionally performed. The desmear process is performed to enhance plating power for the formation of the plating seed layer 120 by applying surface roughness onto the surface of the insulating layer 11.

Figure 5:
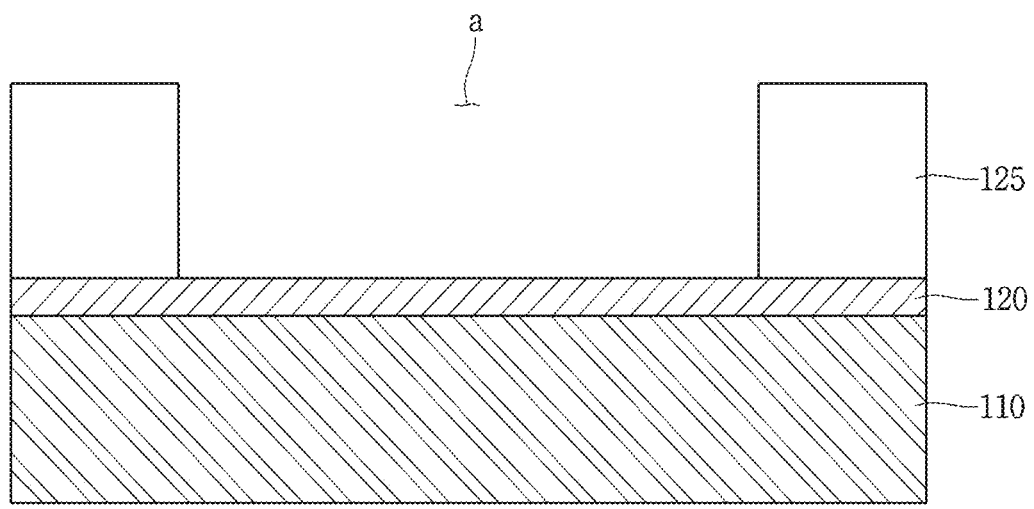

Thereafter, referring to FIG. 5, a first mask 125 is formed on the plating seed layer 120. In this case, the first mask 125 may include a dry film.

In this case, the first mask 125 has an opening a to expose at least a portion of the top surface of the plating seed layer 120.

In this case, the top surface of the plating seed layer 120 exposed by the opening a of the first mask 125 corresponds to an area for the circuit pattern 130.

In other words, the first mask 125 having the opening a to expose the area for the circuit pattern 130 in the top surface of the plating seed layer 120 is formed on the plating seed layer 120.

In this case, the first mask 125 may be formed to cover the whole top surface of the plating seed layer 120. Accordingly, the opening a may be formed by removing a portion of an area of the plating seed layer 120 for the formation of the circuit pattern 130.

Figure 6:
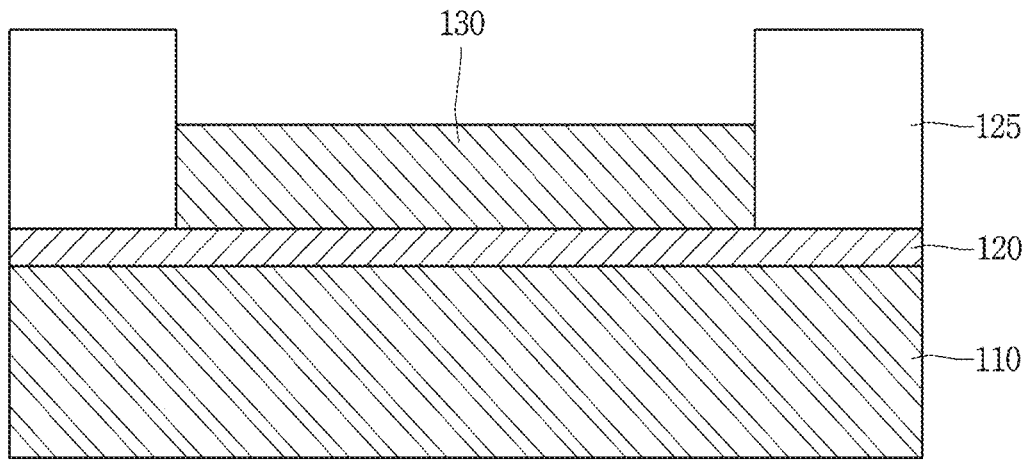

Next, referring to FIG. 6, the circuit pattern 130 is formed on the plating seed layer 120 so that the circuit pattern 130 is filled in at least a portion of the opening a of the first mask 125.

The circuit pattern 130 may be formed while being filled in the at least a portion of the opening a of the first mask 125 by performing electroplating with respect to the plating seed layer 120 serving as a seed layer using a conductive material, preferably, the alloy including Cu.

Figure 7:
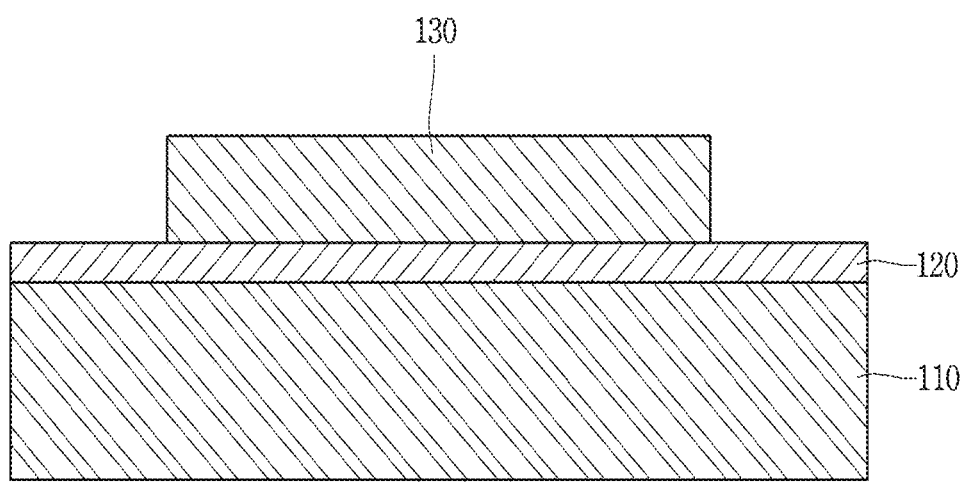

Next, referring to FIG. 7, the first mask 125 is removed from the plating seed layer 120.

In this case, after the first mask 125 has been removed, the residues of the first mask 125 may remain on the surface of the plating seed layer 120. Accordingly, an additional process of removing the residues of the first mask 125 may be performed.

Figure 8:
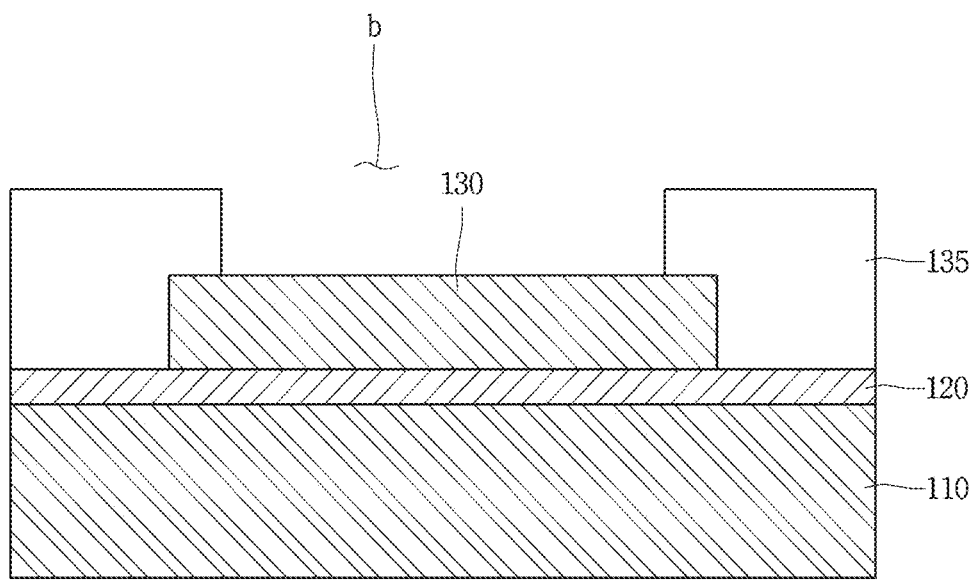

Then, referring to FIG. 8, a second mask 135 is formed on the plating seed layer 120.

In this case, preferably, the second mask 135 may include a dry film having strong heat resistance and an easy removable property.

The second mask 135 includes an opening b to expose top surface of the circuit pattern 130.

In this case, the opening b of the second mask 135 is formed with a width narrower than that of the top surface of the circuit pattern 130.

Accordingly, at least a portion of the top surface of the circuit pattern 130 is covered by the second mask 135. Preferably, the central area of the top surface of the circuit pattern 130 is exposed to the outside by the opening b of the second mask 135, and the edge areas of the top surface of the circuit pattern 130 is covered by the second mask 135.

Figure 9:
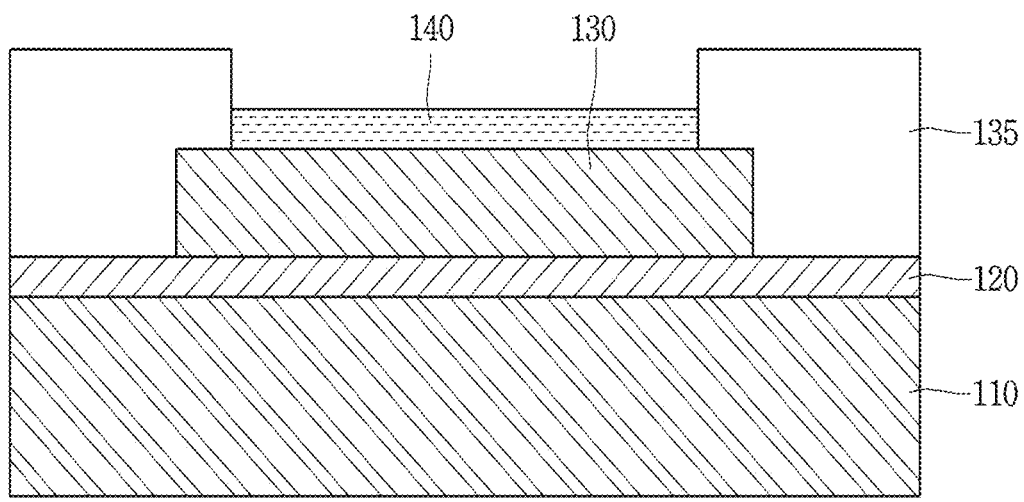

Next, referring to FIG. 9, the surface treatment layer 140 is formed on the circuit pattern 130 by employing both of the plating seed layer 120 and the circuit pattern 130 as a seed layer.

In this case, the surface treatment layer 140 is formed with a width equal to that of the opening b of the second mask 135.

The surface treatment layer 140 may be formed of metal including only gold (Au) or the alloy including Au.

When the surface treatment layer 140 is formed of the alloy including Au, the surface treatment layer 140 may be formed of the Au alloy including Co. In this case, the surface treatment layer 140 may be formed through the electroless plating.

Preferably, the surface treatment layer 140 is formed by performing the electroplating with respect to the plating seed layer 120 which is the same as a plating seed layer used when the circuit pattern 130 is formed. In other words, the surface treatment layer 140 is formed through the electroplating as the plating seed layer 120 is connected with the circuit pattern 130 so that a short occurs between the plating seed layer 120 and the circuit pattern 130.

The surface treatment layer 140 is formed on the circuit pattern 130 so that the bottom surface of the surface treatment layer 140 directly makes contact with the top surface of the circuit pattern 130.

In this case, the surface treatment layer 140, which exists before the plating seed layer 120 is removed, includes top and bottom surfaces having widths narrower than that of the top surface of the circuit pattern 130.

Accordingly, the top surface of the circuit pattern 130 includes a part that makes contact with the surface treatment layer 140 and a part that does not make contact with the surface treatment layer 140.

Figure 10:
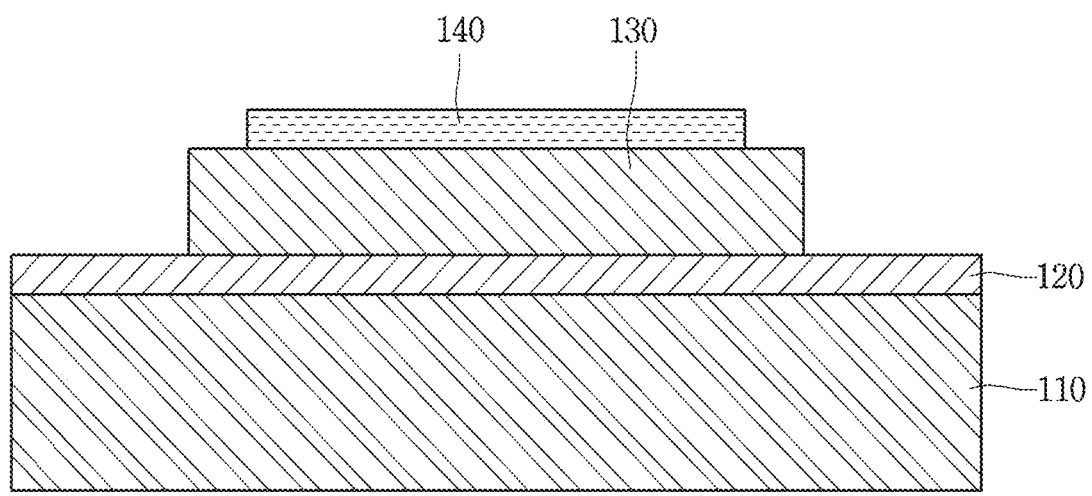

Next, referring to FIG. 10, the second mask 135 formed on the plating seed layer 120 is removed.

In this case, if the second mask 135 is removed similarly to the process of removing the first mask 125, an additional process may be performed to remove the residues of the second mask 135 remaining on the plating seed layer 120.

Figure 11:
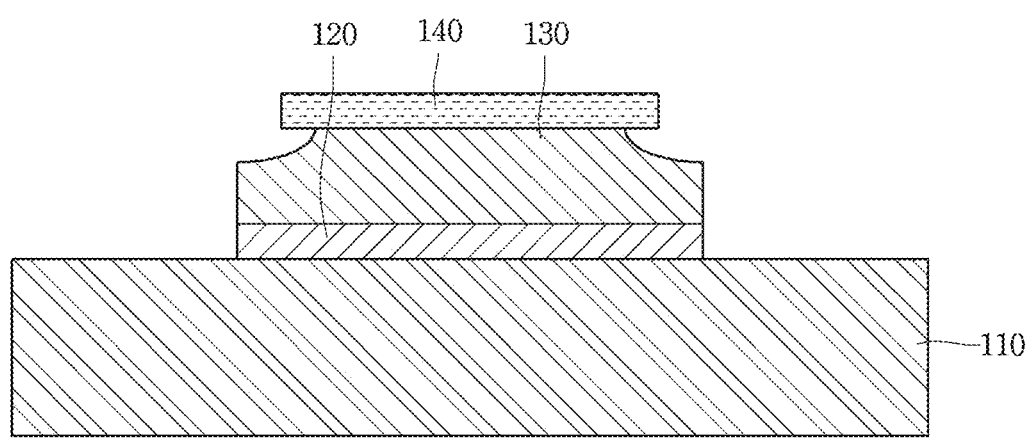

Thereafter, referring to FIG. 11, a process of removing a portion of the plating seed layer 120, which is formed on the insulating layer 110 and has no the circuit pattern 130, is performed.

In other words, after the second mask 135 has been removed, the process of removing the portion of the plating seed layer 120 formed on the insulating layer 110 is performed. In this case, when the process of removing the plating seed layer 120 is performed, a portion of the plating seed layer 120 which is formed under the circuit pattern 130 is not removed due to the circuit pattern 130, but only the portion of the plating seed layer 120 having no circuit pattern 130 is selectively removed.

In this case, edge areas of the top surface of the circuit pattern 130 have no the surface treatment layer 140. Accordingly, when the process of removing the portion of the plating seed layer 120, which is formed on the insulating layer 110 and has no the circuit pattern 130, is performed, the edge areas of the top surface of the circuit pattern 130, which are not covered by the surface treatment layer 140, are also removed.

In this case, only a portion of the top surface of the circuit pattern 130, which is not covered by the surface treatment layer 140, is removed.

Accordingly, upper lateral sides of the circuit pattern 130 are removed with a predetermined curvature differently from the lower portion of the circuit pattern 130.

Therefore, the bottom surface of the surface treatment layer 140 may have the width wider than that of the top surface of the circuit pattern 130.

In addition, due to the process of removing the above plating seed layer 120, the bottom surface of the surface treatment layer 140 includes a first bottom surface directly making contact with the top surface of the circuit pattern 130 and second bottoms surface that does not make contact with the top surface of the circuit pattern 130.

In this case, the first bottom surface of the surface treatment layer 140 may be the central area of the bottom surface of the surface treatment layer 140, and the second bottom surfaces of the surface treatment layer 140 may be left and right areas of the surface treatment layer 140.

Meanwhile, the top and bottom surfaces of the surface treatment layer 140 may have the widths narrower than the width of the bottom surface of the circuit pattern 130.

In other words, as the edge areas of the upper portion of the circuit pattern 130 are removed in the process of removing the plating seed layer 120, the circuit pattern 130 may be divided into the first part 131 and the second part 132 as described above.

The bottom surface of the first part 131 of the circuit pattern 130 directly makes contact with the top surface of the plating seed layer 120.

In this case, the first part 131 of the circuit pattern 130 has a shape in which the top surface and the bottom surface of the first part 131 have equal widths.

In addition, the second part 132 of the circuit pattern 130 has a shape in which the top surface and the bottom surface have mutually different widths.

In other words, in the second part 132 of the circuit pattern 130, the width of the top surface is narrower than that of the bottom surface. Accordingly, the lateral sides of the second part 132 are formed with a predetermined curvature lengthwise.

In this case, the second part 132 of the circuit pattern 130 may include the first lateral side having the first curvature and the second lateral side having the second curvature. In addition, the first curvature of the first lateral side may be substantially equal to the second curvature of the second lateral side.

Therefore, the circuit pattern 130 has left and right lateral sides, and each of the left and right lateral sides includes a first portion substantially perpendicular to a main surface and a second portion extending from the first portion and including a curved surface having a predetermined curvature.

Accordingly, as shown in FIG. 2, the surface treatment layer 140 has the eave structure of protruding outward from the upper lateral side of the circuit pattern 130.

As described above, according to the disclosure, the surface treatment layer 140 including Au is formed by utilizing the plating seed layer 120 used when the circuit pattern 130 is formed, so that the nickel (Ni) surface treatment layer serving as the seed layer for the gold (Au) surface treatment layer may be omitted In addition, as described above, according to the disclosure, the conventional nickel (Ni) surface treatment layer is omitted, and the surface treatment layer 140 including gold (Au) is formed directly on the circuit pattern 130, thereby increasing the electrical conductivity, and reducing the electrical resistance. Accordingly, the RF characteristic may be improved.

In addition, as described above, according to the disclosure, the surface treatment layer 140 formed on the circuit pattern 130 has the eave structure of protruding outward from the upper lateral side of the circuit pattern 130, so that the mounting area of the components mounted on the circuit pattern may be increased. Accordingly, the reliability of a customer may be improved.

Figure 12:
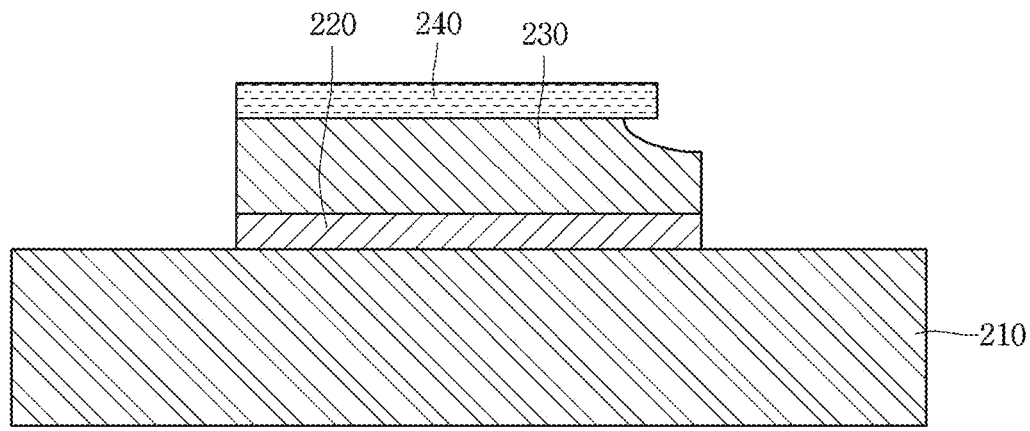
FIG. 12 is a sectional view showing the structure of a printed circuit board according to the second embodiment of the disclosure.

FIG. 12 is a sectional view showing the structure of a printed circuit board according to the second embodiment of the disclosure.

Referring to FIG. 12, a printed circuit board 200 includes an insulating layer 210, a plating seed layer 220, a circuit pattern 230, and a surface treatment layer 240.

The insulating layer 210 may mean a support substrate of the printed circuit board 100 having a single circuit pattern, and mean an insulating layer area having one circuit pattern 230 in a printed circuit board having a plurality of lamination structures.

The insulating layer 210 may constitute an insulating plate, and may include a thermosetting or thermoplastic polymeric substrate, a ceramic substrate, an organic-inorganic composite substrate, or a glass fiber impregnated substrate. If the insulating layer 210 includes the polymeric resin, the insulating layer 210 may include epoxy insulating resin, or may include polyimide based resin.

The circuit pattern 230 is formed on the insulating layer 210.

Preferably, the plating seed layer 120 for the formation of the circuit pattern 230 is formed between the insulating layer 210 and the circuit pattern 230.

The top and bottom surfaces of the plating seed layer 220 may have equal widths.

In addition, the circuit pattern 230 is formed on the plating seed layer 220.

Differently from the plating seed layer 220, the circuit pattern 230 may have a shape in which the top and bottom surfaces thereof have mutually different widths. In this case, the width of the bottom surface of the circuit pattern 230 may be equal to that of the top surface or the bottom surface of the plating seed layer 220. The width of the top surface of the circuit pattern 230 may be narrower than that of the bottom surface of the circuit pattern 230.

The plating seed layer 220 and the circuit pattern 230 are formed of metal including Cu and having electrical conductivity.

The circuit pattern 230 may be formed through an additive process, a subtractive process, a modified semi-additive process (MSAP), or a semi-additive process (SAP), which is a typical process of fabricating a printed circuit board, and the details thereof will be omitted.

Although drawings show that a single circuit pattern 230 is formed on the insulating layer 210, a plurality of circuit patterns 230 may be formed on at least one of the top surface and the bottom surface of the insulating layer 210 while being spaced apart from each other by a predetermined distance.

In this case, the circuit pattern 230 may have a shape similar to that of the circuit pattern 130 according to the first embodiment. Although both lateral sides of the circuit pattern 130 according to the first embodiment have a predetermined curvature, the circuit pattern 230 according to the second embodiment has a predetermined curvature only at an upper right lateral side thereof.

In other words, the left lateral side of the circuit pattern 230 is substantially perpendicular to the bottom surface of the circuit pattern 230, and the right lateral side of the circuit pattern 230 has a portion substantially perpendicular to the bottom surface of the circuit pattern 230 and a curved surface portion extending from the perpendicular portion and having a predetermined curvature.

The surface treatment layer 240 is formed on the circuit pattern 230 to perform the surface treatment of the circuit pattern 230.

The surface treatment layer 240 may be formed of metal including only Au or the alloy including Au.

When the surface treatment layer 240 is formed of the alloy including Au, the surface treatment layer 240 may be formed of the Au alloy including Co. In this case, the surface treatment layer 240 is formed through electroless plating.

Preferably, the surface treatment layer 240 is formed by performing the electroplating with respect to the plating seed layer 220 which is the same as the plating seed layer used when the circuit pattern 230 is formed.

The surface treatment layer 240 is formed on the circuit pattern 230, so that the bottom surface of the surface treatment layer 240 directly makes contact with the top surface of the circuit pattern 230.

In this case, the surface treatment layer 240 includes the bottom surface having a width wider than that of the top surface of the circuit pattern 230.

Accordingly, the bottom surface of the surface treatment layer 240 includes a first bottom surface that directly makes contact with the top surface of the circuit pattern 230 and a second bottom surface that does not make contact with the top surface of the circuit pattern 230.

In this case, the first bottom surface of the surface treatment layer 240 may include the central area and a left area of the bottom surface of the surface treatment layer 240, and the second bottom surface of the surface treatment layer 240 may include a right area of the surface treatment layer 240.

In addition, the surface treatment layer 240 may have a shape in which the top and bottom surfaces thereof have equal widths.

Meanwhile, both of the top and bottom surfaces of the surface treatment layer 240 may have widths narrower than that of the bottom surface of the circuit pattern 230.

Accordingly, differently from that of the first embodiment, the surface treatment layer 240 according to the second embodiment has an eave structure of protruding outward from only the upper lateral side of the circuit pattern 230.

As described above, according to the disclosure, the surface treatment layer 240 including Au is formed utilizing the plating seed layer 220 used when the circuit pattern 230 is formed, so that the nickel (Ni) surface treatment layer serving as the seed layer for the gold (Au) surface treatment layer may be omitted.

In addition, as described above, according to the disclosure, the conventional nickel (Ni) surface treatment layer is omitted, and the surface treatment layer 140 including gold (Au) is formed directly on the circuit pattern 130, thereby increasing the electrical conductivity, and reducing the electrical resistance. Accordingly, the RF characteristic may be improved.

In addition, as described above, according to the disclosure, the surface treatment layer 240 formed on the circuit pattern 230 has an eave structure of protruding outward from the upper right lateral side of the circuit pattern 230, so that the mounting area of the components mounted on the circuit pattern 230 may be increased. Accordingly, the reliability of a customer may be improved.

Hereinafter, a method of fabricating the printed circuit board shown in FIG. 12 will be described with reference to FIGS. 13 to 15.

Figure 13:
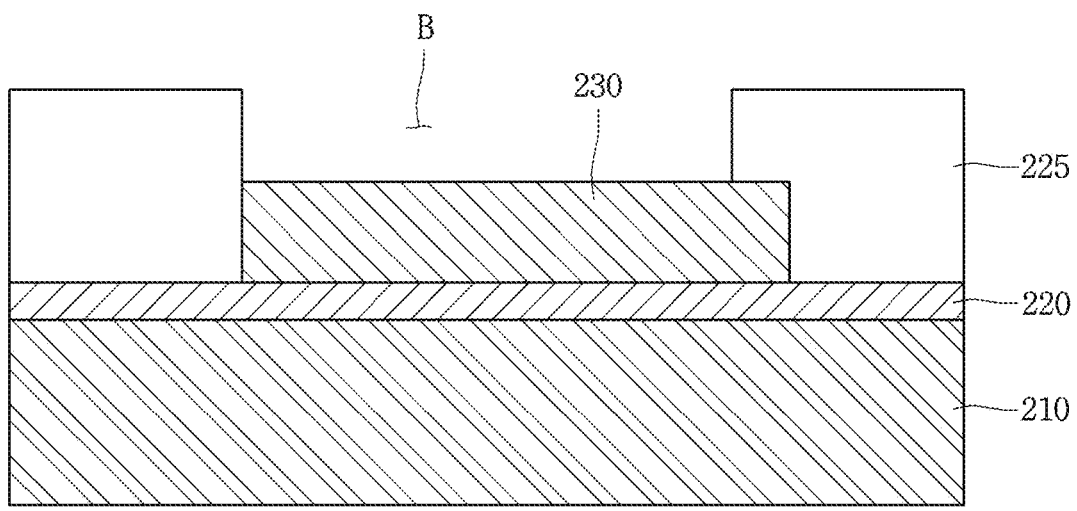
FIGS. 13 to 15 are sectional views showing a method of fabricating the printed circuit board of FIG. 12.
Figure 14:
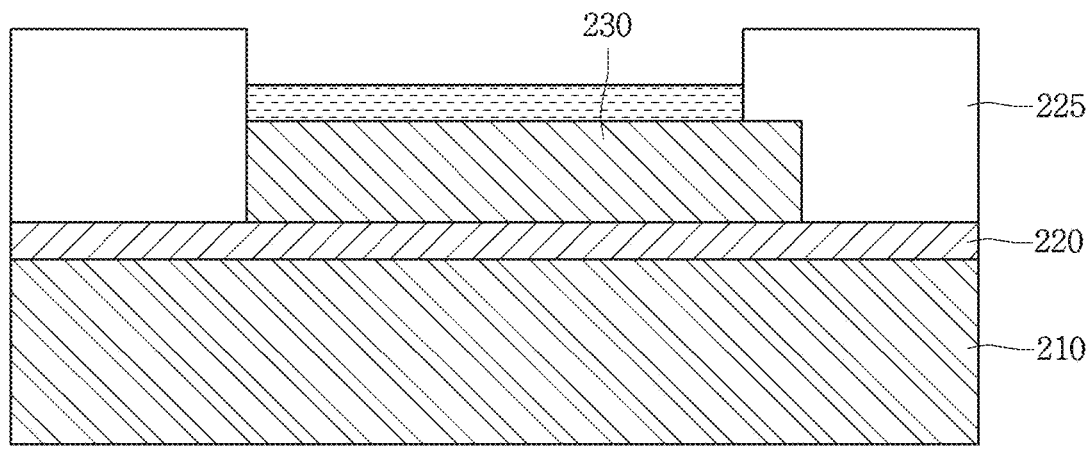
Figure 15:
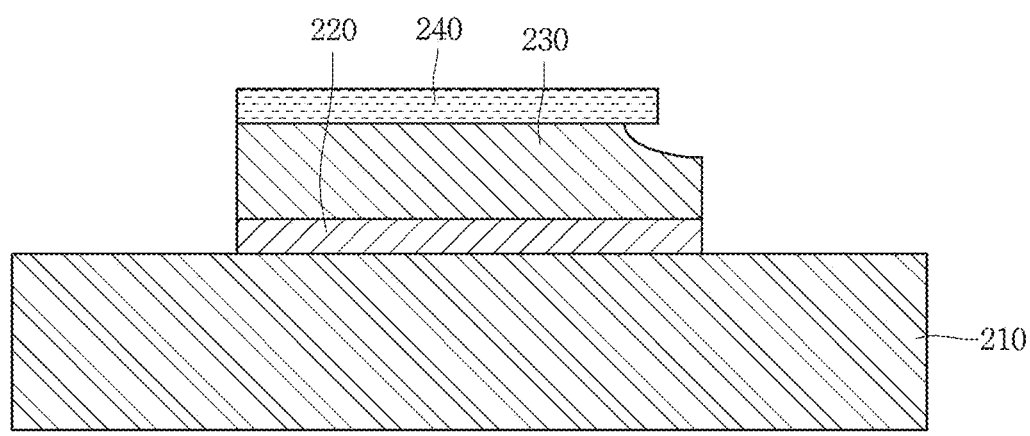

FIGS. 13 to 15 are sectional views showing the method of fabricating the printed circuit board shown in FIG. 12 in process sequence.

First, referring to FIG. 13, after preparing the insulating layer 210, the plating seed layer 220 is formed on the prepared insulating layer 210.

The plating seed layer 220 may be formed by performing electroless plating with respect to the insulating layer 110 using metal including Cu.

The insulating layer 210 may include a thermosetting or thermoplastic polymeric substrate, a ceramic substrate, an organic-inorganic composite substrate, or a glass fiber impregnated substrate. If the insulating layer 210 includes the polymeric resin, the insulating layer 210 may include epoxy insulating resin, or may include polyimide based resin.

Next, the circuit pattern 230 is formed by performing electroplating with respect to the plating seed layer 220 serving as a seed layer using a conductive material, preferably, the alloy including Cu.

Thereafter, a mask 225 is formed on the plating seed layer 220.

In this case, preferably, the mask 225 may include a dry film having strong heat resistance and an easy removable property.

The mask 225 includes an opening B to expose the top surface of the circuit pattern 230.

The width of the opening B of the mask 225 is narrower than that of the top surface of the circuit pattern 230.

Accordingly, at least a portion of the top surface of the circuit pattern 230 is covered by the mask 225. Preferably, the central area and the left area of the top surface of the circuit pattern 230 are exposed to the outside by the opening B of the mask 225, and the right edge area of the top surface of the circuit pattern 230 is covered by the mask 225.

Next, referring to FIG. 14, the surface treatment layer 240 is formed on the circuit pattern 230 by employing the plating seed layer 220 and the circuit pattern 230 as a seed layer.

In this case, the surface treatment layer 240 has a width equal to that of the opening B of the mask 225.

The surface treatment layer 240 may be formed of metal including only Au or the alloy including Au.

When the surface treatment layer 240 is formed of the alloy including Au, the surface treatment layer 240 may be formed of the Au alloy including Co. In this case, the surface treatment layer 240 is formed through electroless plating.

Preferably, the surface treatment layer 240 is formed by performing the electroplating with respect to the plating seed layer 220 which is the same as the plating seed layer used when the circuit pattern 230 is formed. In other words, the surface treatment layer 240 is formed through the electroplating as the plating seed layer 220 is connected with the circuit pattern 230 so that a short occurs between the plating seed layer 220 and the circuit pattern 230.

The surface treatment layer 240 is formed on the circuit pattern 230 so that the bottom surface of the surface treatment layer 240 directly makes contact with the top surface of the circuit pattern 230.

In this case, the surface treatment layer 240, which exists before the plating seed layer 220 is removed, includes top and bottom surfaces having a width narrower than that of the top surface of the circuit pattern 230.

Accordingly, the top surface of the circuit pattern 230 includes a portion, which makes contact with the surface treatment layer 240, and a portion which does not make contact with the surface treatment layer 240.

Thereafter, referring to FIG. 15, the mask 225 is removed from the plating seed layer 220.

Then, a process of removing a portion of the plating seed layer 220, which is formed on the insulating layer 210 and has no circuit pattern 230, is performed.

In other words, after the mask 225 has been removed, the process of removing the portion of the plating seed layer 220, which is formed on the insulating layer 210 and has no circuit pattern 230, is performed. In this case, when the process of removing the portion of the plating seed layer 220, which is formed on the insulating layer 210 and has no circuit pattern 230, is performed, a portion of the plating seed layer 120 which is formed under the circuit pattern 130 is not removed due to the circuit pattern 130, but only the portion of the plating seed layer 220 having no circuit pattern 130 is selectively removed.

In this case, a right edge area of the top surface of the circuit pattern 230 has no surface treatment layer 240. Accordingly, when the process of removing the plating seed layer 220 is performed, the right edge area of the top surface of the circuit pattern 230, which are not covered by the surface treatment layer 240, are also removed.

In this case, only the upper portion of the circuit pattern 230, which is not covered by the surface treatment layer 240, is removed.

Accordingly, the upper right portion of the circuit pattern 230, which is not covered by the surface treatment layer 240, has a lateral side with a predetermined curvature differently from that of the lower portion of the circuit pattern 230.

Accordingly, the bottom surface of the surface treatment layer 240 has a width wider than that of the top surface of the circuit pattern 230.

The bottom surface of the surface treatment layer 240 includes a first bottom surface, which directly makes contact with the top surface of the circuit pattern 230, and a second bottom surface which does not make contact with the top surface of the circuit pattern 230 due to the process of removing the plating seed layer 220.

In this case, the first bottom surfaces of the surface treatment layer 240 may include the central area and a left area of the bottom surface of the surface treatment layer 240, and the second bottom surface of the surface treatment layer 240 may include the right area of the surface treatment layer 240.

Meanwhile, the top and bottom surfaces of the surface treatment layer 240 may have widths narrower than that of the bottom surface of the circuit pattern 230.

In addition, the upper right lateral side of the circuit pattern 230 is formed with a predetermined curvature lengthwise.

Accordingly, as shown in FIG. 12, the surface treatment layer 240 has an eave structure of protruding outward from the upper right lateral side of the circuit pattern 230.

As described above, according to the disclosure, the surface treatment layer 240 including Au is formed using the plating seed layer 220 used when the circuit pattern 230 is formed, so that the nickel (Ni) surface treatment layer serving as the seed layer for the gold (Au) surface treatment layer may be omitted.

In addition, as described above, according to the disclosure, the conventional nickel (Ni) surface treatment layer is omitted, and the surface treatment layer 140 including gold (Au) is formed directly on the circuit pattern 130, thereby increasing the electrical conductivity, and reducing the electrical resistance. Accordingly, the RF characteristic may be improved.

In addition, as described above, according to the disclosure, the surface treatment layer 240 formed on the circuit pattern 230 has an eave structure of protruding outward from the upper lateral side of the circuit pattern 230, so that the mounting area of the components mounted on the circuit pattern may be increased. Accordingly, the reliability of a customer may be improved.

Figure 16:
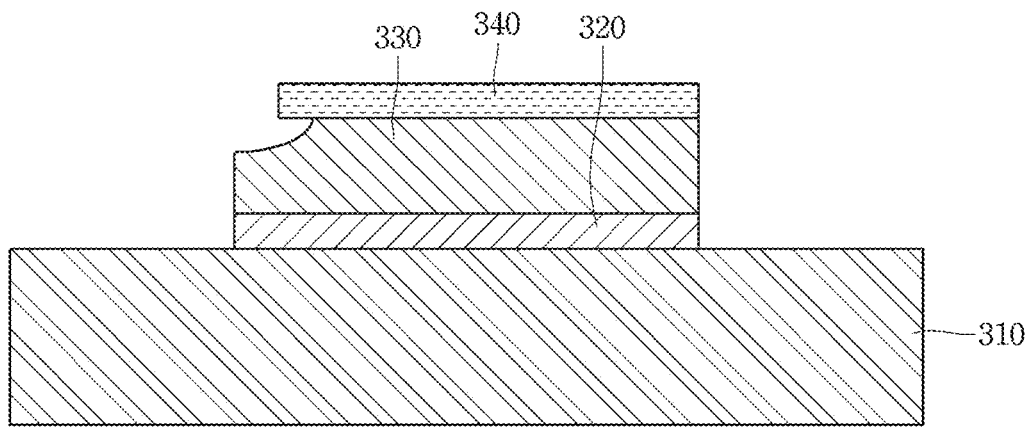
FIG. 16 is a sectional view showing the structure of a printed circuit board according to the third embodiment of the disclosure.

FIG. 16 is a sectional view showing the structure of a printed circuit board according to the third embodiment of the disclosure.

Referring to FIG. 16, a printed circuit board 300 includes an insulating layer 310, a plating seed layer 320, a circuit pattern 330, and a surface treatment layer 340.

In this case, since the insulating layer 310 and the plating seed layer 320 are the same as those of the first embodiment and the second embodiment, the details thereof will be omitted.

In addition, the circuit pattern 230 according to the second embodiment includes an upper right lateral side having a predetermined curvature.

However, the circuit pattern 330 according to the third embodiment of the disclosure has an upper left lateral side having a predetermined curvature, and a right lateral side is formed to be substantially perpendicular to the bottom surface.

Figure 17:
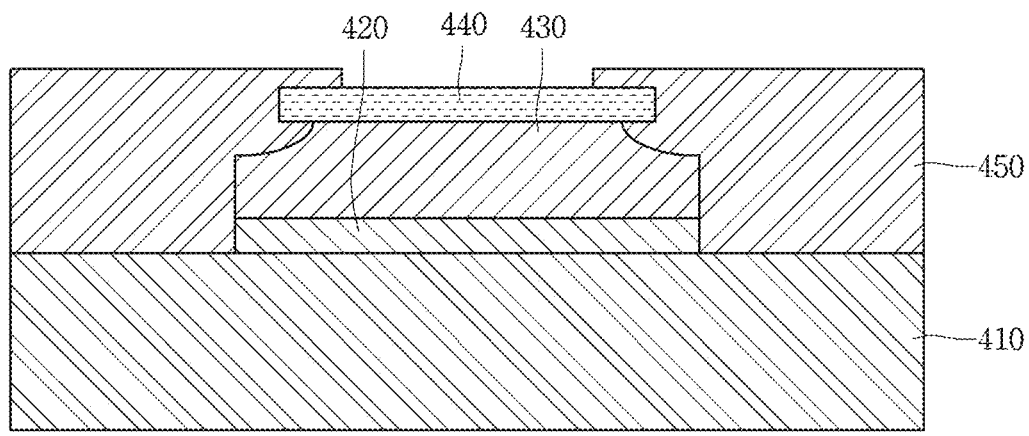
FIG. 17 is a sectional view showing the structure of a printed circuit board according to the fourth embodiment of the disclosure.

FIG. 17 is a sectional view showing a printed circuit board 400 according to a fourth embodiment of the disclosure.

Referring to FIG. 17, the printed circuit board 400 includes an insulating layer 410, a plating seed layer 420, a circuit pattern 430, a surface treatment layer 440, and a protective layer 450.

In this case, since the insulating layer 410, the plating seed layer 420, the circuit pattern 430, and the surface treatment layer 440 are the same as those of the printed circuit board according to the first embodiment of the disclosure shown in FIG. 2, the details thereof will be omitted.

The printed circuit board 400 according to the fourth embodiment further includes a protective layer 450 formed on the insulating layer 410 to cover the surface of the insulating layer 410, the lateral side of the plating seed layer 420, the lateral side of the circuit pattern 430, and a portion of the top surface of the surface treatment layer 440.

The protective layer 450 protrudes from the top surface of the surface treatment layer 440 by a predetermined height.

The protective layer 450 may include solder resist, protect the surface of the insulating layer 410, and at least a portion of the top surface of the surface treatment layer 240 of the circuit pattern formed on the insulating layer 410.

The protective layer 450 according to the fourth embodiment covers the exposed entire surface of the insulating layer 410.

Figure 18:
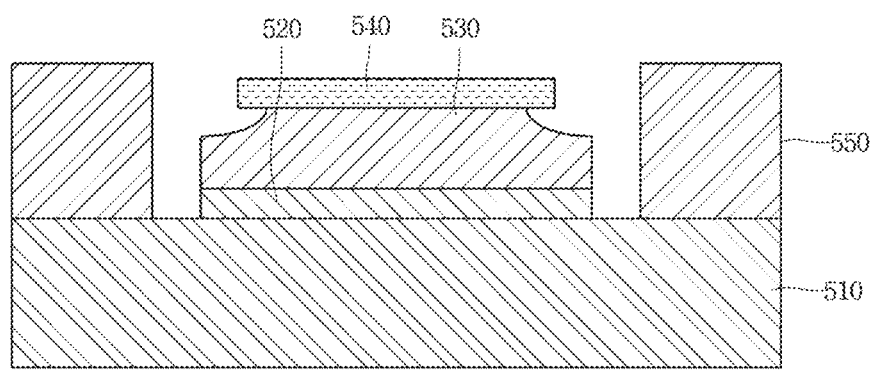
FIG. 18 is a sectional view showing the structure of a printed circuit board according to the fifth embodiment of the disclosure.

FIG. 18 is a sectional view showing a printed circuit board according to a fifth embodiment.

Referring to FIG. 18, a printed circuit board 500 includes an insulating layer 510, a plating seed layer 520, a circuit pattern 530, a surface treatment layer 540, and a protective layer 550.

Since the insulating layer 510, the plating seed layer 520, the circuit pattern 530, and the surface treatment layer 540 are the same as those of the printed circuit board according to the first embodiment of the disclosure shown in FIG. 2, the details thereof will be omitted.

The printed circuit board 500 according to the fifth embodiment further includes the protective layer 550 formed on the insulating layer 510 to cover a portion of the surface of the insulating layer 510.

The protective layer 550 is formed on the insulating layer 510 and spaced apart from the circuit pattern 530 by a predetermined distance.

The protective layer 550 may include solder resist, protect the surface of the insulating layer 510, and expose the top surface of the surface treatment layer 540 of the circuit pattern formed on the insulating layer 510 and a portion of the surface of the insulating layer 510.

According to the embodiment of the disclosure, the surface treatment layer is formed by utilizing a removable film-type material and a plating seed layer used in the circuit pattern, so that the electrolytic surface treatment and the electroless surface treatment may be selectively used without the limitation on the design.

According to the embodiment of the disclosure, the surface treatment layer including Au is formed using the plating seed layer used when the circuit pattern is formed, so that a Ni surface treatment layer serving as a seed layer for the Au surface treatment layer according to the related art may be omitted. Accordingly, the thickness of a product may be reduced, and product cost may be reduced due to the omission of the Ni surface treatment layer.

In addition, according to the disclosure, the conventional nickel (Ni) surface treatment layer is omitted, and the surface treatment layer 140 including gold (Au) is formed directly on the circuit pattern 130, thereby increasing the electrical conductivity, and reducing the electrical resistance. Accordingly, the RF characteristic may be improved.

Further, according to the embodiment of the disclosure, the surface treatment layer formed on the circuit pattern has an eave structure of protruding outward from the upper lateral side of the circuit pattern, so that the mounting area of the components mounted on the circuit pattern may be increased. Accordingly, the reliability of a customer may be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A circuit board comprising:
   an insulating layer;
   a first metal layer disposed on the insulating layer; and
   a second metal layer disposed on the first metal layer such that the first metal layer is disposed between the second metal layer and the insulating layer,
   wherein the first metal layer includes:
      an upper surface in contact with the second metal layer;
      a lower surface opposite from the upper surface and facing the insulating layer; and
      a side surface disposed between the upper surface and the lower surface,
   wherein at least a part of the side surface of the first metal layer overlaps the second metal layer in a vertical direction,
   wherein the side surface of the first metal layer includes a curved portion,
   wherein the first metal layer includes a first portion in which a width of the first metal layer gradually increases in the vertical direction from the upper surface of the first metal layer toward the lower surface of the first metal layer,
   wherein the first portion of the first metal layer includes the curved portion of the side surface of the first metal layer, and
   wherein the first metal layer includes:
      a first region overlapped by the second metal layer in the vertical direction; and
      a second region that is not overlapped by the second metal layer in the vertical direction.

2. The circuit board of claim 1, wherein a width of the second metal layer is greater than a width of the upper surface of the first metal layer.

3. The circuit board of claim 2, wherein the first metal layer includes copper (Cu), and
   wherein the second metal layer includes a different metal than the first metal layer.

4. The circuit board of claim 1, wherein the first metal layer includes copper (Cu), and
   wherein the second metal layer includes a different metal than the first metal layer.

5. The circuit board of claim 1, wherein a thickness of the first metal layer is greater than a thickness of the second metal layer.

6. The circuit board of claim 1, wherein a width of the lower surface of the first metal layer is greater than a width of the upper surface of the first metal layer.

7. The circuit board of claim 1, wherein the curved portion of the side surface of the first metal layer has a concave shape inwardly of the first metal layer.

8. The circuit board of claim 1, comprising a seed layer disposed between the first metal layer and the insulating layer,
   wherein an upper surface of the seed layer is in contact with the lower surface of the first metal layer, and
   wherein a lower surface of the seed layer is in contact with the insulating layer.

9. The circuit board of claim 1, comprising a protective layer disposed on the insulating layer to cover a surface of the second metal layer.

10. The circuit board of claim 9, wherein the protective layer includes an opening overlapping the second metal layer in the vertical direction.

11. A circuit board comprising:
an insulating layer;
a first metal layer disposed on the insulating layer;
a second metal layer disposed on the first metal layer; and
a protective layer disposed on the insulating layer to cover a surface of the insulating layer,
wherein the first metal layer includes:
an upper surface in contact with the second metal layer;
a lower surface opposite from the upper surface and facing the insulating layer; and
a side surface disposed between the upper surface and the lower surface,
wherein at least a part of the side surface of the first metal layer overlaps the second metal layer in a vertical direction,
wherein the side surface of the first metal layer includes a curved portion, and
wherein a width of the second metal layer is greater than a width of the upper surface of the first metal layer and smaller than a width of the lower surface of the first metal layer.

12. The circuit board of claim 11, wherein the second metal layer overlaps at least a part of the curved portion of the first metal layer in the vertical direction and is spaced apart from at least a part of the curved portion of the first metal layer.

13. The circuit board of claim 11, wherein a lower surface of the second metal layer includes:
a first portion in direct physical contact with the upper surface of the first metal layer; and
a second portion that is not in contact with the upper surface of the first metal layer.

14. The circuit board of claim 13, wherein the first metal includes:
a first portion in contact with the second metal layer; and
a second portion disposed below the first portion of the first metal layer,
wherein the curved portion is formed within the first portion of the first metal layer, and
wherein the second portion of the lower surface of the second metal layer is spaced apart from the first portion of the first metal layer.

15. The circuit board of claim 14, wherein the second portion of the first metal layer includes:
a first region overlapped by the second metal layer in the vertical direction; and
a second region that is not overlapped by the second metal layer in the vertical direction.

16. The circuit board of claim 14, comprising a seed layer disposed between the insulating layer and the first metal layer and including copper,
wherein the first metal layer includes copper,
wherein the lower surface of the first metal layer is in direct physical contact with an upper surface of the seed layer,
wherein the second metal layer includes gold, and
wherein the first portion of the lower surface of the second metal layer that is in direct physical contact with the upper surface of the first metal layer includes gold.

17. The circuit board of claim 11, wherein a height of an upper surface of the protective layer is different from a height of the upper surface of the first metal layer.

18. The circuit board of claim 11, wherein the protective layer includes a solder resist.

19. The circuit board of claim 11, wherein a width of the upper surface of the first metal layer is smaller than a width of the lower surface of the first metal layer.

20. A circuit board comprising:
an insulating layer;
a first metal layer disposed on the insulating layer;
a second metal layer disposed on the first metal layer; and
a protective layer disposed on the insulating layer to cover a surface of the insulating layer,
wherein the first metal layer includes:
an upper surface in contact with the second metal layer;
a lower surface opposite from the upper surface and facing the insulating layer; and
a side surface disposed between the upper surface and the lower surface,
wherein at least a part of the side surface of the first metal layer overlaps the second metal layer in a vertical direction,
wherein the side surface of the first metal layer includes a curved portion, and
wherein the protective layer is formed to cover the side surface of the first metal layer and a part of an upper surface of the second metal layer.

* * * * *